United States Patent [19]

Leonowich

[11] Patent Number: 5,063,359
[45] Date of Patent: Nov. 5, 1991

[54] LOW-JITTER OSCILLATOR

[75] Inventor: Robert H. Leonowich, Temple, Pa.

[73] Assignee: AT&T Bell Laboratories, Murray Hill, N.J.

[21] Appl. No.: 614,325

[22] Filed: Nov. 15, 1990

[51] Int. Cl.$^5$ .............................. H03B 5/36
[52] U.S. Cl. .................. 331/116 FE; 331/108 C; 331/158
[58] Field of Search ............ 331/45, 60, 108 C, 115, 331/116 R, 116 FE, 117 R, 117 FE, 132, 158, 175

[56] References Cited

U.S. PATENT DOCUMENTS 4,383,224 5/1983 Saari .................... 331/116 FE X
4,853,655 8/1989 Embree et al. ............. 331/116 FE

OTHER PUBLICATIONS

"An Analysis of Inverter Crystal Oscillators", RF Design, INFO/CARD 23, Aug. 1989, Leonard L. Kleinberg, pp. 28,29,31,32.
"Negative Gain-Single Pole Oscillators", RF Design, INFO/CARD 30, Sep. 1990, Leonard L. Kleinberg, pp. 35, 36, & 38.
Modern Communication Circuits, Jack Smith, McGraw-Hill Book Company, 1986, pp. 238-278.

Primary Examiner—David Mis
Attorney, Agent, or Firm—S. W. McLellan

[57] ABSTRACT

An oscillator, such as a crystal oscillator, is presented for low jitter (low phase noise) applications, such as in frequency synthesizers or digital repeaters. The two terminals of a resonator are coupled to the input and output of an amplifier, the amplifier together with other components effecting a negative impedance. The inputs of a comparator are connected to the terminals of the resonator. The output of the comparator, preferably differential, is a signal having a frequency substantially determined by the resonator.

11 Claims, 2 Drawing Sheets

LOW-JITTER OSCILLATOR

Background of the Invention

Most electronic systems, such as analog or digital receivers/transmitters, require high-stability, low-jitter oscillators to control the operation and/or emissions thereof. For example, a modern radio receiver or transmitter utilizes a frequency synthesizer to establish the desired frequency for communication. For a transmitter, stability of the synthesizer is paramount in establishing the exact frequency of emission. In addition, the synthesizer generates a certain amount of noise which is transmitted along with the desired modulation. For example, if the synthesizer has considerable "jitter", i.e., the instantaneous frequency of the signal from the synthesizer varies rapidly with time (as opposed to slow variations, such as frequency drift), the emission from the transmitter will have incidental frequency (or phase) modulation of noise. This is sometimes referred to as phase noise on the transmitted signal and degrades the overall signal-to-noise ratio of the emission. The Federal Communication Commission has established limitations on the amount of phase noise that may be present in certain emissions, and meeting the limitations may be difficult and expensive.

It is noted that the signal-to-noise degradation is true for radio receivers; a noisy frequency synthesizer used as a local oscillator in superheterodyne receiver will also degrade the signal-to-noise ratio of the received signal.

In digital communication systems, the same problems discussed above occurs when a transmitter or receiver has jitter on its output signal. System limitations on the amount of jitter that may be tolerated may complicate the transmitter/receiver design, impose impossible jitter performance objectives on tandem digital repeaters, and drive up the cost of such products to intolerable levels.

A significant contributor to jitter in a frequency synthesizer or digital communication system is instability of the reference oscillator(s) therein. The frequency reference determines the output frequency of a frequency synthesizer, the pulse rate and phase of the digital data being transmitted, or the sampling rate and decision in a digital receiver. Variations in the frequency reference's frequency or phase can multiplied many times in a system, the overall effect being that the frequency reference may substantially determine the noise performance of the system as a whole.

A typical frequency reference is crystal oscillator which, depending on the application and requirements, may be placed in a temperature controlled environment to control its long-term variations in frequency. By and large, crystal oscillators have excellent frequency stability with well known, long-term, aging characteristics affecting the variations in its frequency. The jitter characteristics of such an oscillator is also very good but still may not be good enough for certain, critical, applications.

SUMMARY OF THE INVENTION

It is therefore one aspect of the invention to provide in an electronic system a simple, low cost, oscillator which has very low jitter characteristics.

It is another aspect of the invention to provide in an electronic system a low-jitter oscillator which may be implemented in an integrated circuit, exclusive of the resonator used to determined the operating frequency of the oscillator.

These and other aspects of the invention may be obtained generally in an electronic system by having a means for generating a negative resistance disposed across two terminals of a resonator, and a comparator whose inputs are connected to the two terminals of the resonator. The output of the comparator is a signal having a frequency substantially determined by the resonator.

In addition, the above aspects may be additionally obtained generally in an electronic system by the steps of generating a negative resistance and coupling that negative resistance to the two terminals of a resonator and comparing the voltages on the two terminals of the resonator to each other with a comparator. The output of the comparator is a signal having a frequency substantially determined by the resonator.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
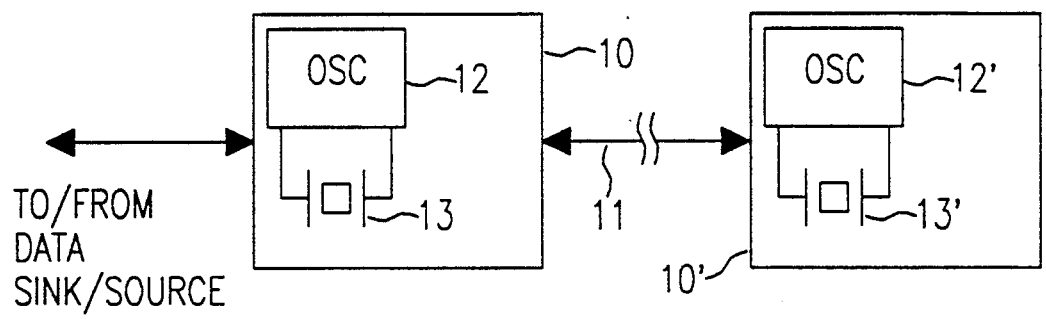
FIG. 1 is a simplified block diagram of an electronic system having crystal controlled oscillators therein.

In FIG. 1, two electronic systems 10, 10' are shown communicating via an appropriate transmission medium 11. For example, if the systems 10, 10' are respectively a radio transmitter and a radio receiver, the transmission medium 11 would likely to be the "either". Alternatively, if the systems 10, 10' are, respectively, a digital transmitter and a digital receiver, the transmission medium 11 would likely be a twisted pair of wires or a coaxial cable. In common with each kind of system 10, 10', a frequency reference is provided which establishes the operating frequency or transmission rate of systems 10, 10'. These frequency references are shown in each systems 10, 10' as oscillators 12, 12', with the frequency thereof substantially determine by the resonant frequency of crystal resonators 13, 13'. For example, in a radio transmitter or receiver, the oscillators 12, 12' are part of a frequency synthesizer. In a digital transmitter or receiver, the oscillators 12, 12' are part of a master clock system for controlling and synchronizing the functions thereof.

Figure 2:
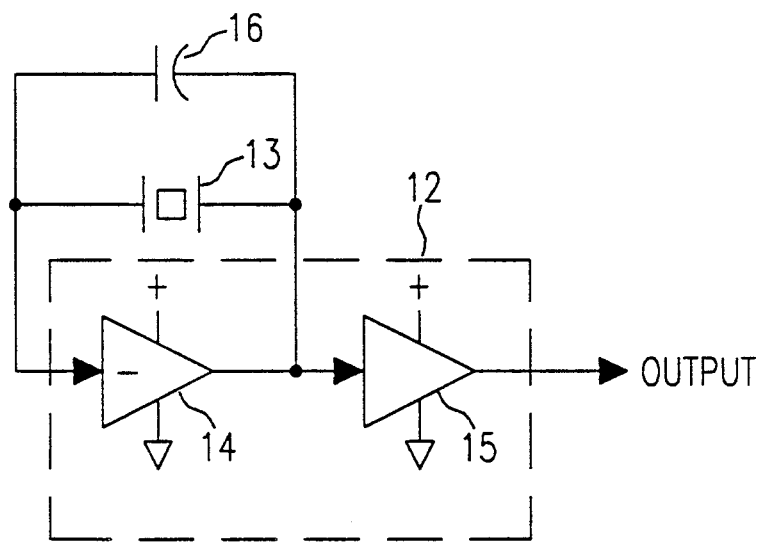
FIG. 2 is a simplified diagram of a crystal oscillator according to the prior art.
Figure 3:
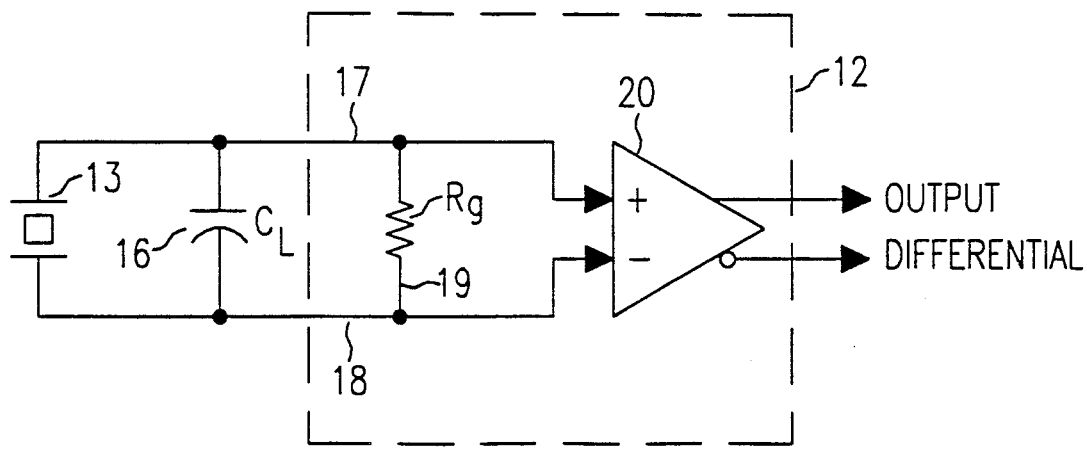
FIG. 3 is a simplified diagram of the instant invention.

Briefly, the invention shown in FIG. 3 is an improvement in the crystal oscillators of the prior art (FIG. 2) by having a means for generating a negative resistance 19 disposed across two terminals of a resonator 13, and a comparator 20 whose inputs are connected to the two terminals of the resonator. The output of the comparator 20 is a signal having a frequency substantially determined by the resonator 13.

For purposes here, it is noted that jitter is typically referred to as the uncertainty of the frequency of a signal at any point in time. While the average frequency of a signal may be well known (subject to long-term wander and other variations), jitter is typically measured by variations in the instantaneous frequency or phase, the variations being of a higher frequency than a predetermined limit, e.g., above one KHz. Depending on the application of the signal, jitter is sometimes known as phase noise. It is also known that other variations in a signal may occur; amplitude variations may also occur, although this problem may be less serious than pure jitter, jitter and amplitude variations may interact to some extent.

Crystal oscillators of the prior art to some extent suffer from jitter noise added to the output signal therefrom. One such crystal oscillator is shown in FIG. 2. This circuit, typically known as a Pierce oscillator, combines two inverting amplifiers, 14, 15, such as CMOS inverters with suitable biasing networks (not shown), as the oscillator 12. Amplifier 14, here an inverting amplifier, provides the necessary gain for oscillation to take place while amplifier 15 serves as a buffer for the output of amplifier 14. The crystal resonator 13 is disposed across the amplifier 14 in combination with parallel capacitor 16. Capacitor 16 serves to place the resonant frequency of the crystal resonator 13 at the desired frequency; typcially, most crystal resonators 13 have a specified load capacitance which places the resonant frequency of the crystal to the desired oscillation frequency. While the oscillating combination of the crystal 13, inverting amplifier 14, and load capacitor 16 may have a low jitter signal at the output thereof, the coupling and amplification of the signal from the output of the amplifier 14 by buffer amplifier 15 contributes a dominant amount of jitter to the output signal. The jitter arises from many sources, such as any power supply noise coupled to the buffer amplifier 15. If the amplifiers 14, 15 are implemented on a chip with other logic circuits, adequate bypassing of the power supply to the amplifiers 14, 15 to reduce the jitter may not be practically possible.

An oscillator circuit 12 which has substantially lower jitter noise than that of the prior art oscillators is shown in FIG. 3. The crystal resonator 13, in parallel with the load capacitor 16, is coupled to an effective negative impedance 19 ($-R_g$) via nodes 17 and 18. The generation of the negative impedance 19 will be discussed in more detail below. In addition, the two inputs of a comparator 20 are coupled to the nodes 17, 18 to place the comparator 20 in parallel with the resonator 13/capacitor 16/negative resistance 19 combination. The output of the comparator 20, shown here having a differential output, provides the low jitter output signal of the oscillator 12. Using a fully differential comparator reduces the jitter from the oscillator 12 resulting from power supply noise. In addition, it is preferable that all circuits coupling to the output of the oscillator 12 also be differential. This is advantageous generally since differential signals, being "balanced" signals, are less susceptible to coupled noise than single-ended signals and circuits using differential signals are less sensitive to power supply noise than non-differential circuits. In addition, a differential signal has twice the peak-to-peak signal swing compared to a single-ended signal, thereby increasing the signal-to-noise ratio and reducing the effects of noise still further.

The oscillator 12 may be used advantageously in driving most high-level mixers, such a diode ring mixers, since this kind of mixer utilizes balanced differential signals to achieve wide dynamic range and high mixer port-to-port isolation.

It is sufficient to state here that the magnitude of the negative resistance 19 is sufficiently large to effect oscillations when combined with the losses in the crystal resonator 13, capacitor 16, comparator 20, and any other circuit elements attached to nodes 17, 18.

Figure 4:
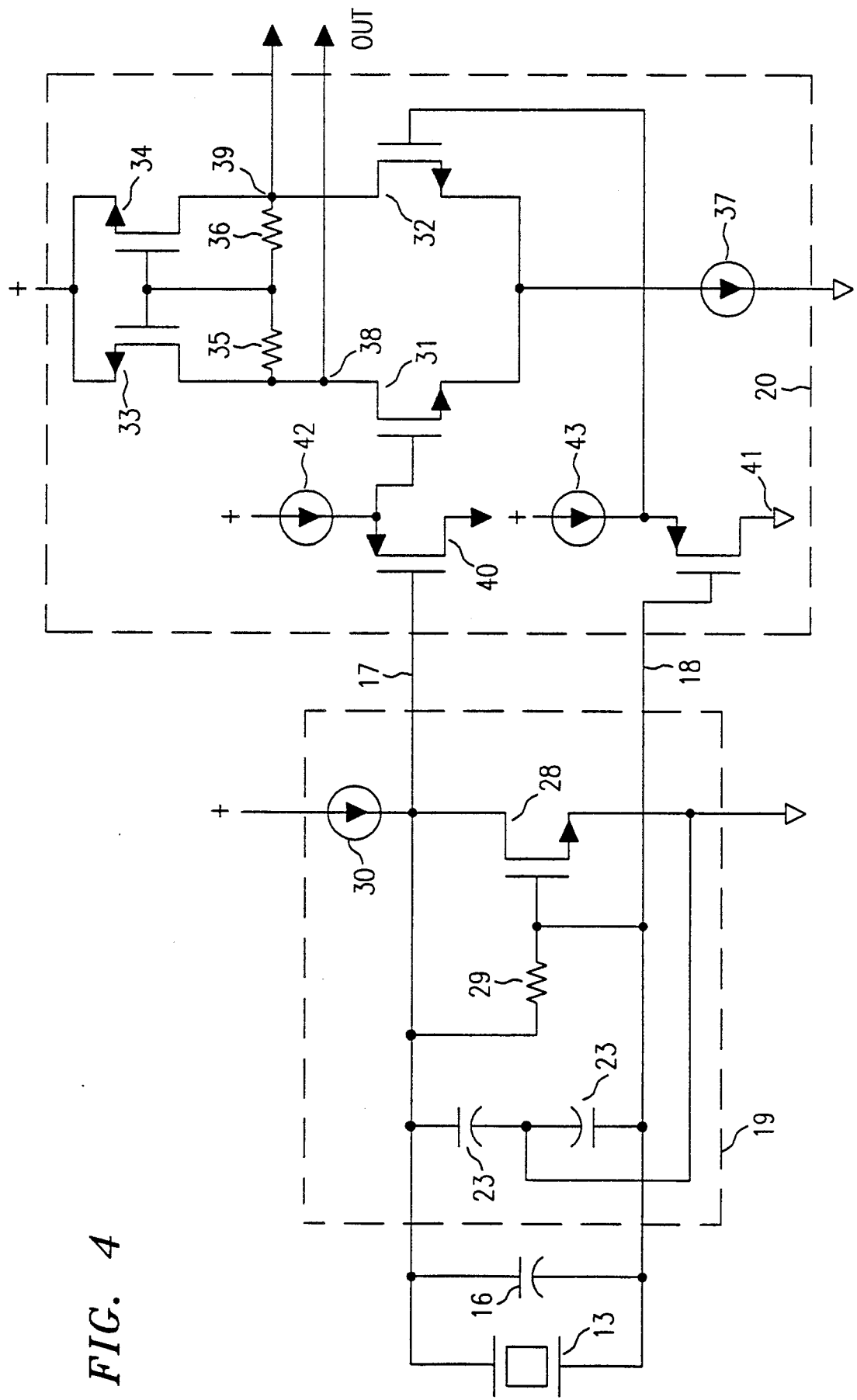
FIG. 4 is a detailed circuit diagram of the negative impedance generator and comparator shown in FIG. 3.

An exemplary implementation of the negative impedance 19 and comparator 20 is shown in FIG. 4. The generation of the negative impedance 19 is shown as a transistor 28 having a resistor 29 coupled between the drain of the transistor and the gate thereof. THe drain of transistor 28 couples to the node 17 while the gate couples to the node 18. A constant current source 30 provides current to the node 17. Two series-coupled capacitors 23 (which are not necessarily of the same value), having a common terminal coupled to the source of the transistor 28, are combined with the transistor 28 and resistor 29 to produce the negative impedance, $-R_g$, across the nodes 17, 18. In addition, capacitors 23 contribute a reactive component to the negative impedance, $-R_g$, which must be taken into account when determining the value of capacitor 16. It is understood that with the proper capacitance values for capacitors 23, load capacitor 16 may not be needed.

The comparator 20 has two transistors 31, 32 with common sources coupled to a current source 37. The gates of transistors 31, 32 couple to the nodes 17, 18, via voltage level shifters (transistors 40, 41), as the inputs to the comparator 20. The drains of transistors 31, 32 couple to corresponding output nodes 38, 39. The load of the comparator is an active, bilateral, load of transistors 33, 34 and resistors 35, 36. Transistors 33, 34 have common gates and source terminals, the common source terminals thereof coupling to the power supply. Resistors 35, 36, in series between the output nodes 38, 39, have a common node coupled to the common gates of transistors 33, 34. The drains of transistors 33, 34 couple to corresponding output nodes 38, 39. Transistors 40, 41, acting as source followers, level shift the signals on the nodes 17, 18 to give the transistors 31, 32 sufficiently high average gate voltages so that transistors 31, 32 operate in their saturated region. Current sources 42, 43, coupled to the corresponding sources of transistors 40, 41 and to the corresponding gates of transistors 31, 32, trickle sufficient current to operate transistors 40, 41 and to charge the gate capacitances of transistors 31, 32.

EXAMPLE

The following exemplary and approximate component values were used in the circuit shown in FIG. 4 to form a 20 MHz crystal oscillator with less than 500 picosecond peak-to-peak of jitter for use in an interface to a local area network:

| | |
|---|---|
| crystal resonator 13 | 20 MHz, M-tron Corp. MP-1 (Mod) |
| capacitor 16 | not used |
| capacitors 23 | 100 pF each |
| transistor 28 | n-channel MOSFET 3000 × 2 $\mu$m, gm $\approx$ 20 mmho |
| resistor 29 | 10K$\Omega$ |
| current source 30 | 1 mA |
| transistors 31, 32 | n-channel MOSFET 40 × 2 $\mu$m, gm $\approx$ 0.3 mmho |
| transistors 33, 34 | p-channel MOSFET 40 × 2 $\mu$m, gm $\approx$ 0.3 mmho |
| resistors 35, 36 | 10K$\Omega$ each |

-continued

| | |
|---|---|
| current source 37 | 40 μA |
| transistors 40, 41 | p-channel MOSFET, 10 × 2 μm, gm ≈ 50 μmho |
| current sources 42, 43 | 5 μA each |
| power supply voltage | 5 volts |

Having described the preferred embodiment of this invention, it will now be apparent to one of skill in the art that other embodiments incorporating its concept may be used. It is felt, therfore, that this invention should not be limited to the disclosed embodiment, but rather should be limited only by the spirit and scope of the appended claims.

I claim:

1. In an electronic system, an oscillator CHARACTERIZED BY:
    a resonator having two terminals;
    a means for generating a negative resistance, coupled to the terminals of the resonator; and,
    a comparator, having two inputs coupled to corresponding terminals of the resonator, and having at least one output;
    wherein the output of the of the comparator is a signal having a frequency substantially determined by the resonator.

2. The electronic system as recited in claim 1, further comprising:
    a capacitor means coupled to the terminals of the resonator.

3. The electronic system as recited in claim 2, wherein the means for generating a negative resistance is characterized by:
    a transistor, having an input and two outputs, the input coupled to one terminal of the resonator and a first one of the two outputs coupled to the other terminal of the resonator; and,
    a resistor coupled to the terminals of the resonator; and wherein the capacitor means is characterized by:
    a first capacitor coupled between one terminal of the resonator and the second one of the outputs of the transistor; and,
    a second capacitor coupled between the other terminal of the resonator and the second one of the outputs of the transistor.

4. The electronic system as recited in claim 3, wherein the comparator has a differential output.

5. The electronic system as recited in claim 4, wherein the resonator is a crystal resonator.

6. The electronic system as recited in claim 5, wherein the transistor is a MOSFET.

7. The electronic system as recited in claim 1, wherein the means for generating a negative resistance and the comparator are formed on an integrated circuit.

8. A method of generating a high-stability, low jitter, signal of a predetermined frequency, as substantially determined by a resonator having two terminals, for use in an electronic system, CHARACTERIZED BY THE STEPS OF:
    generating a negative resistance;
    coupling the negative resistance to the two terminals of the resonator; and,
    comparing the voltages on each terminal of the resonator to each other with a comparator;
    wherein the high-stability, low jitter, signal is produced at the output of the comparator.

9. The method of generating a signal as recited in claim 8, wherein the comparator has differential outputs.

10. The method of generating a signal as recited in claim 9, wherein the resonator is a crystal resonator.

11. The method of generating a signal as recited in claim 10, wherein the negative resistance and the comparator are formed in an integrated circuit.

* * * * *